(12) United States Patent  (10) Patent No.: US 9,214,623 B1
Thalmayr  (45) Date of Patent: Dec. 15, 2015

(54) DOPED PIEZOELECTRIC RESONATOR

(71) Applicant: Analog Devices, Inc., Norwood, MA (US)

(72) Inventor: Florian Thalmayr, Unterhaching (DE)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 13/744,979

(22) Filed: Jan. 18, 2013

Related U.S. Application Data

(60) Provisional application No. 61/587,702, filed on Jan. 18, 2012.

(51) Int. Cl.
*H01L 41/18* (2006.01)
*H03H 9/145* (2006.01)
*H03H 9/25* (2006.01)

(52) U.S. Cl.
CPC .............. *H01L 41/18* (2013.01); *H03H 9/145* (2013.01); *H03H 9/25* (2013.01)

(58) Field of Classification Search
CPC ........ H01L 41/18; H01L 41/187; H03H 9/13; H03H 9/145
USPC ...................................................... 310/313 R
See application file for complete search history.

(56) References Cited

U.S. PATENT DOCUMENTS

| | | | |
|---|---|---|---|
| 5,592,010 A | 1/1997 | Kakumu et al. | |
| 6,972,510 B2 | 12/2005 | Klee et al. | |
| 7,586,239 B1 | 9/2009 | Li et al. | |
| 7,834,524 B2 | 11/2010 | Wang et al. | |
| 8,058,769 B2 | 11/2011 | Chen et al. | |
| 8,362,675 B2 | 1/2013 | Chen et al. | |
| 8,742,854 B1 | 6/2014 | Lee et al. | |
| 2004/0021403 A1 | 2/2004 | Ayazi et al. | |
| 2004/0065940 A1 | 4/2004 | Ayazi et al. | |
| 2005/0241395 A1 | 11/2005 | Takahashi et al. | |
| 2006/0044078 A1 | 3/2006 | Ayazi et al. | |
| 2006/0125576 A1 | 6/2006 | Ho et al. | |
| 2008/0003770 A1 | 1/2008 | Enomoto et al. | |
| 2008/0186109 A1 | 8/2008 | Ho et al. | |
| 2008/0246559 A1 | 10/2008 | Ayazi et al. | |
| 2008/0297281 A1 | 12/2008 | Ayazi et al. | |
| 2010/0038991 A1 | 2/2010 | Shih et al. | |
| 2010/0127596 A1 | 5/2010 | Ayazi et al. | |
| 2010/0127798 A1 | 5/2010 | Ayazi et al. | |
| 2010/0182102 A1 | 7/2010 | Kuypers et al. | |
| 2010/0244624 A1* | 9/2010 | Matsuda et al. | 310/313 B |

(Continued)

OTHER PUBLICATIONS

Akiyama et al., "Enhancement of Piezoelectric Response in Scandium Aluminum Ntiride Alloy Thin Films Prepared by Dual Reactive COsputtering", Advanced Materials, 2009, vol. 21, pp. 593-596, WILEY-VCH Verlag GmbH & Company. LGaA, Weinheim.*

(Continued)

*Primary Examiner* — Derek Rosenau

(74) *Attorney, Agent, or Firm* — Wolf, Greenfield & Sacks, P.C.

(57) ABSTRACT

Mechanical resonators including doped piezoelectric active layers are described. The piezoelectric active layer(s) of the mechanical resonator may be doped with a dopant type and concentration suitable to increase the electromechanical coupling coefficient of the active layer. The increase in electromechanical coupling coefficient may all for improved performance and smaller size mechanical resonators than feasible without using the doping.

18 Claims, 5 Drawing Sheets

(56) References Cited

U.S. PATENT DOCUMENTS

| | | |
|---|---|---|
| 2010/0308927 A1 | 12/2010 | Rebel et al. |
| 2010/0314969 A1 | 12/2010 | Gaidarzhy et al. |
| 2010/0319185 A1 | 12/2010 | Ayazi et al. |
| 2011/0050366 A1 | 3/2011 | Ayazi et al. |
| 2011/0240617 A1 | 10/2011 | Xu et al. |
| 2012/0074810 A1* | 3/2012 | Chen et al. ............... 310/313 R |
| 2013/0021304 A1* | 1/2013 | Zuo et al. .................... 345/204 |
| 2013/0099629 A1 | 4/2013 | Ayazi et al. |

OTHER PUBLICATIONS

Jaakkola et al., Temperature compensated resonance modes of degenerately n-doped silicon MEMS resonators. Freq Control Symp. 2012 IEEE Intl. May 21-24, 2012;1-5.

Keyes, Electronic Effects in the Elastic Properties of Semiconductors. Solid State Phys. 1968;20:37-90.

Pensala et al., Bulk acoustic wave propagation characteristics in degenerately n-doped Si. Freq Control Symp. 2012 IEEE Intl. May 21-24, 2012;1-4.

Pensala et al., Temperature compensation of silicon MEMS Resonators by Heavy Doping. Ultrason Symp. 2011 IEEE Intl. Oct. 18-21, 2011;1952-5.

Samarao et al., Intrinsic Temperature Compensation of Highly Resistive High-Q Silicon Microresonators via Charge Carrier Depletion. FCS-IEEE Intl Freq Control Symp. 2010;334-9.

Samarao, Temperature compensation of silicon micromechanical resonators via degenerate doping. Electron Devices Meeting. 2009 IEEE Intl. Dec. 7-9, 2009;1-4.

Office communication mailed Feb. 17, 2015 for U.S. Appl. No. 13/542,200.

* cited by examiner

DOPED PIEZOELECTRIC RESONATOR

RELATED APPLICATIONS

This application claims the benefit under 35 U.S.C. §119 (e) of U.S. Provisional Application Ser. No. 61/587,702, entitled "DOPED PIEZOELECTRIC RESONATOR" filed on Jan. 18, 2012, which is herein incorporated by reference in its entirety.

BACKGROUND

Piezoelectric mechanical resonators are known. They utilize piezoelectric materials for transduction from (into) electrical signals into (from) mechanical signals.

BRIEF SUMMARY

According to an aspect of the present application a device is provided, comprising a piezoelectric lamb wave resonator comprising a piezoelectric active layer formed of a first material and configured to vibrate in response to an actuation signal, wherein the piezoelectric active layer comprises a dopant configured to increase a piezoelectric coupling coefficient of the piezoelectric active layer.

According to an aspect of the present application, a device is provided comprising a mechanical resonator with at least one piezoelectric layer comprising a piezoelectric material, wherein the piezoelectric material contains a second material which modifies its native piezoelectric constant.

BRIEF DESCRIPTION OF DRAWINGS

Various aspects and embodiments of the application will be described with reference to the following figures. It should be appreciated that the figures are not necessarily drawn to scale. Items appearing in multiple figures are indicated by the same reference number in all the figures in which they appear.

DETAILED DESCRIPTION

Figure 1A:
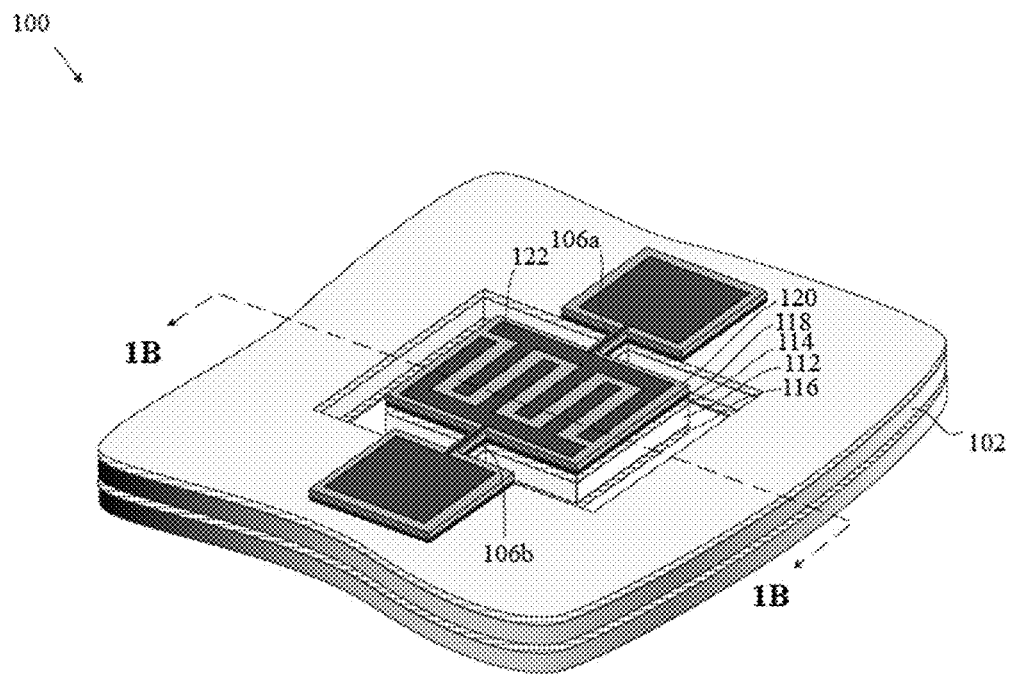
FIGS. 1A and 1B illustrate a perspective view and cross-sectional view, respectively, of a mechanical resonator to which aspects of the present application may apply.

Some aspects of the present application relate to doping of the piezoelectric active layer material of a piezoelectric resonator, which in some non-limiting embodiments may be a Lamb wave resonator. For example, doping of AlN with scandium or other materials may be performed to increase the piezoelectric constant of the actuation layer of a lamb wave resonator (or other suitable piezoelectric resonator) in which the actuation layer comprises AlN. Such doping may provide enhanced mechanical performance, such as increased electromechanical coupling for one or more modes of interest via increased piezoelectric constant (the induced piezoelectric polarization per unit of stress applied).

Mechanical resonators are used in oscillator circuits, acoustic frequency filters and for various acoustic sensors, such as gyroscopes, and temperature and chemical sensors. In particular, piezoelectric resonators used in these wireless components utilize piezoelectric materials such as Aluminum Nitride (AlN) for transduction from (into) electrical signals into (from) mechanical signals. Piezoelectric resonator performance (e.g., noise performance, etc.) is tightly coupled to the piezoelectric coupling coefficient of the piezoelectric actuation layer. Aspects of the present application provide for improvement of micro-electromechanical Lamb wave resonators (as a non-limiting example) by the usage of Sc-doped AlN as the actuation medium, or other suitably doped piezoelectric actuation medium.

Various aspects of the present application may provide one or more of the following benefits. It should be appreciated that other benefits are possible and that not all embodiments provide all benefits. In some embodiments, usage of micro-electromechanical Lamb wave resonators as frequency filters for frequency control and selection is described. In some embodiments, usage of micro-electromechanical Lamb wave resonators in high-performance oscillator applications is provided. The performance may be improved, for example, by allowing for use of smaller resonators (and the corresponding benefits, such as reduced spurious mode excitation) for a given phase noise, or improved phase noise for a given size resonator, as non-limiting examples. In some embodiments, usage of micro-electromechanical Lamb wave resonators in miniaturized oscillator applications is provided, whereby "miniaturized" refers to the ability to use a smaller resonator than attainable with conventional techniques. In some embodiments, usage of micro-electromechanical Lamb wave resonators as sensitive sensors with superior signal-to-noise ratio is provided.

The present application describes techniques to increase the piezoelectric coupling coefficient of a piezoelectric actuation layer of a piezoelectric resonator. According to one aspect, doping of the piezoelectric actuation layer is used. Such doping may improve the overall device performance (e.g., phase noise (PN), size, spurious mode reduction, increased tuning range, power consumption v. PN trade-off, or temperature compensation behavior v. PN trade-off) for several applications. In one embodiment, the mechanical resonator uses a Lamb wave mode.

According to one aspect, doping of piezoelectric material layers of a mechanical resonator may be performed to increase the piezoelectric coupling constant, thus providing enhanced electromechanical coupling. According to some non-limiting embodiments, the mechanical resonators may be piezoelectric lamb wave resonators. The AlN or other piezo material of the resonator is doped with scandium or other dopant in a suitable manner to increase the piezoelectric coupling coefficient. In some instances, the piezoelectric coupling coefficient can be enhanced by as much as 400%, in some embodiments between 50-100%, between 100-200%, between 150-300%, or any other suitable amount.

As a non-limiting example, for a Sc-doped AlN piezoelectric resonator, the doping may be represented by the formulation $Al_{(1-x)}Sc_xN$, where "x" may be, in some embodiments: smaller than 0.5; smaller than 0.35; smaller than 0.2; smaller than 0.1, or any other suitable value. In some embodiments, it may be preferred to have x in the range between 0.15 and 0.35 as here the increase in piezoelectric constant is maximum, while there are no other negative effects yet.

AlN is a non-limiting example of a suitable piezoelectric material for use in a piezoelectric resonator. Other piezoelectric materials may alternatively be used. For other piezoelectric materials such as zinc oxide, lanthanum niobate or quartz, suitable dopants (e.g., scandium, Hf, Y, Nb, Zr, or other suitable dopants) can be used to control the piezoelectric coupling constant. This tuning of the piezoelectric coupling constant may be isotropic (non-directional) in some embodiments and non-isotropic (directional) in other embodiments. The method of doping may be chosen from a variety of techniques such as ion implantation into undoped crystal structures or in-situ crystal growth, among others.

Figure 1B:
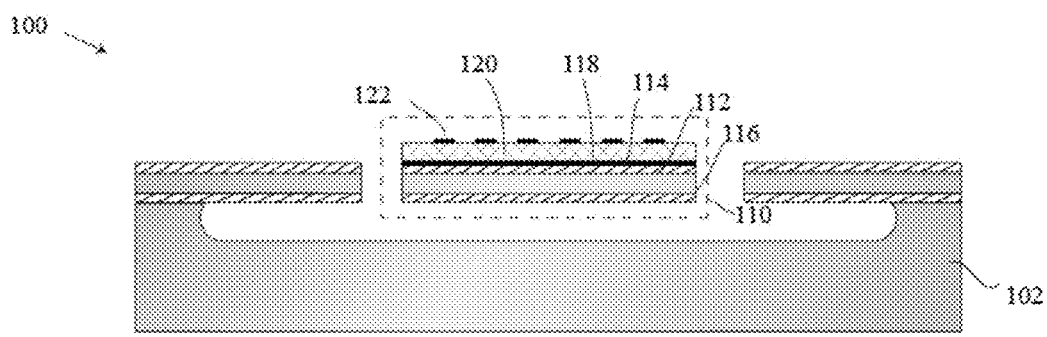

A non-limiting example of an unpackaged MEMS resonator, specifically a Lamb mode resonator is shown in FIGS. 1A and 1B, which illustrate a perspective view and cross-sectional view, respectively. The resonator 100 comprises a plate 110 connected over anchor points 106a and 106b to a substrate 102. The actuation of the active layer 120 can be piezoelectric, electrostatic, or any other suitable method. The resonator may comprise electrodes (here 118 and 122), which may be optimized for excitation of the main mode of vibration.

In some embodiments, a temperature-compensated resonator may be used. For example, layers 112, 114, and 116 may form part of a temperature-compensation structure of the types described in U.S. Pat. No. 8,058,769, which is incorporated herein by reference in its entirety. The various aspects of the present application may be used in combination with such temperature-compensated resonators.

As non-limiting examples, such Lamb wave resonators can be used in sensors, frequency filters, and oscillator applications.

Figure 2A:
FIGS. 2A and 2B illustrate finite element analysis (FEM) simulations, in cross-sectional views, of the mode-shapes of the lowest order symmetric and anti-symmetric modes of vibration, respectively, for a resonator material stack of three different materials.
Figure 2B:
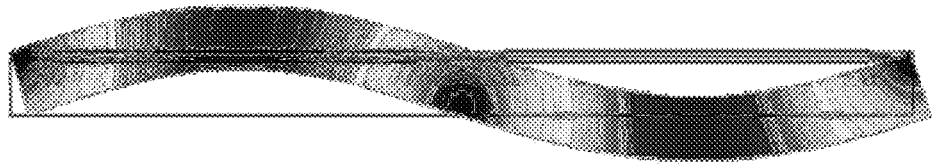

It should be appreciated that vibration shapes and modes of such Lamb mode resonators may be very complex. As a simplified 2D-approximation, Lamb wave resonators will resonate at angular frequencies $$\omega = \nu \beta \quad (1),$$

where $\nu$ is the phase velocity of an eigenmode and $\beta$ is the wave number $$\beta = \frac{n\pi}{L}, \quad (2)$$

with n=1, 2, 3, . . . and L is the length of the resonator. Non-limiting examples of the cross-sectional mode-shapes of vibration of a Lamb-wave resonator are shown in FIGS. 2A and 2B. It should be noted that though the stack (e.g., the combination of materials forming the resonator plate 110) is not entirely symmetric, vibration shapes are still substantially symmetric or anti-symmetric. For FIGS. 2A-2B, the displayed mode number (number of half-wavelengths) of both modes is n=2.

Figure 3:
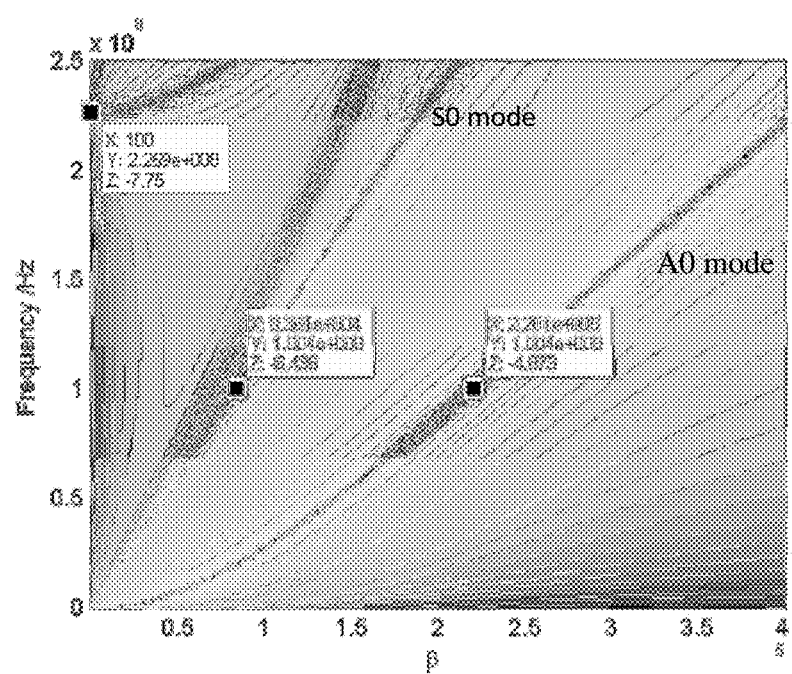
FIG. 3 illustrates the typical dispersion of the lowest order symmetric and anti-symmetric Lamb modes of vibration of a microelectromechanical system (MEMS) resonator.

Typical dispersion behavior for the herein described Lamb wave resonators using lowest order symmetric S0 and anti-symmetric A0 Lamb modes is illustrated in FIG. 3. While the S0 mode only has very slight dispersion, the A0 mode has a strongly varying wave length vs. frequency dispersion. Note also that for the same frequency, the wave length of A0 mode is significantly smaller than for the S0 mode.

It should be appreciated that the size (i.e., the in-plane dimensions of length and width) of such a micro-electromechanical Lamb wave resonator 100 may be smaller than 2 mm, smaller than 1 mm, smaller than 500 um, smaller than 100 um or smaller than 10 um.

It should be further appreciated that the desired frequency of vibration of the described micro-electromechanical Lamb wave resonator may be larger than 16 kHz, larger than 32 kHz, larger than 100 kHz, larger than 1 MHz, larger than 10 MHz, larger than 100 MHz, larger than 1 GHz or even as large as 5 GHz, between approximately 100 MHz and 5 GHz, or any other suitable value.

When measuring the electrical response of a MEMS resonator, e.g., in terms of scattering parameters on two electrical ports, each electrical excitable mode shows up as a resonance peak with a certain insertion loss (IL). The scattering parameter S21 IL of a two-port resonator of any mode of vibration can be calculated as $$IL = 20\log_{10}\left(\frac{2Z_c}{2Z_c + R_m}\right), \quad (3)$$

for each individual mode, where $Z_0$ is the characteristic impedance of the system and $R_m$ is the motional equivalent circuit resistance of the mode. $R_m$ can be represented as $$R_m = \left(\frac{8}{\pi^2 w_0 Q k^2 c_0}\right), \quad (4)$$

with $C_0$ is the static electrode capacitance, and $\omega_0$ and Q are the frequency of resonance and the quality factor of the respective mode. The term $k^2$ is the electromechanical coupling factor of the respective mode, which is a function of the geometrical coupling of the excitation to the mode field and the piezoelectric coupling coefficients of the employed materials. The electromechanical coupling factor can also be approximated (for small coupling coefficient) as a function of resonance frequency $f_r$ and antiresonance frequency $f_a$ $$k^2 = \left(\frac{\pi}{2}\right)^2 \frac{f_a - f_r}{f_a} \quad (5)$$

It should be appreciated that $R_m$ can be calculated from measurement and simulation over $$R_m = \left(\frac{1}{\text{real}(Y_{21})}\right)_{f=f_0}. \quad (6)$$

Figure 4:
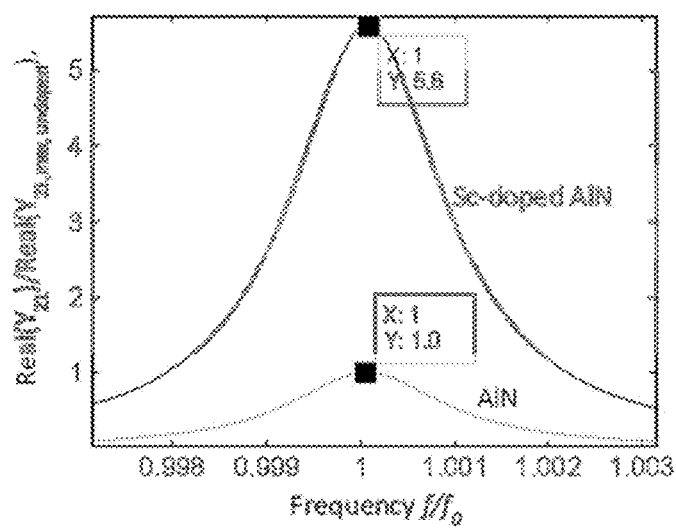
FIG. 4 illustrates a comparison of the normalized conductance Real($Y_{21}$) of the lowest-order symmetric Lamb mode in a resonator with a quality factor Q=500 for a typical temperature-compensated Lamb wave resonator stack comprising silicon, a temperature compensation stack, and two electrode layers.

FIG. 4 compares the conductance real($Y_{21}$) of a Lamb wave resonator around the resonance frequency $f_0$ of a typical temperature compensated MEMS resonator with normal AlN and Sc-doped AlN—both with a quality factor Q=500. The data of FIG. 4 was obtained by FEM simulation. It can be observed that the conductance of the MEMS resonator with Sc-doped is, at resonance, about five times larger than the conductance of the MEMS resonator with undoped AlN and hence $R_m$ is about five times smaller. Furthermore it should be appreciated that the electromechanical coupling factor $k^2$ improves by approximately the same amount for the resonator with Sc-doped AlN.

For certain applications, such as high-performance oscillators it may be desired to have a specified but comparatively low $R_m$ to match the circuit impedance for optimum performance, e.g. 500 Ohm, 100 Ohm, 50 Ohm or 10 Ohm or any other suitable value. It should be appreciated that usage of a Sc-doped AlN MEMS resonator may facilitate matching the specified (low) $R_m$ value and hence improve system performance such as phase noise or jitter.

Figure 5:
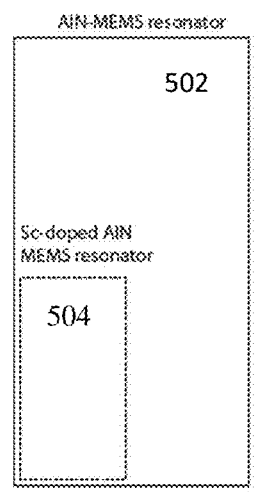
FIG. 5 provides a comparison of the relative size of an AlN-MEMS resonator with a Sc-doped AlN MEMS resonator for constant Rm.

For other applications such as miniaturized and integrated oscillators, the usage of a Sc-doped AlN MEMS resonator enables the reduction of resonator size by a factor of 5 as illustrated in FIG. 5, while keeping the $R_m$ constant. In particular, FIG. 5 illustrates a comparison of the relative size of an AlN-MEMS resonator 502 with a Sc-doped AlN MEMS resonator 504 for constant $R_m$. It should be appreciated that this may enable completely new ways of integration and co-packaging, such as SiP.

It should be appreciated that besides the desired mode of resonance, every MEMS resonator also resonates in a multitude of other modes of vibration, which may corrupt the performance of the MEMS oscillator by introducing frequency jumps, PN distortion or other effects. One of the design goals of MEMS resonators therefore is a design which does not have other modes of resonance close by. It should be appreciated that this is much easier to achieve with a resonator of smaller area.

It should be further appreciated that it often is desired to tune the MEMS oscillator frequency, e.g., for compensation of the frequency offset over temperature. Methods for tuning MEMS oscillators comprise tuning over the phase or pulling the resonator with the electrical circuit. Another possibility for tuning a MEMS oscillator is the tuning of the MEMS resonator itself by electrical boundary condition tuning. Here a certain area of the resonator is reserved for tuning electrodes on top and bottom of the piezoelectric layer and by variation of the impedance between the tuning electrodes it is possible to change the propagation speed in that portion of the MEMS resonator and hence it is possible to change the frequency of resonance/tune the MEMS oscillator. It should be appreciated that application of this concept is corrupted by several practical aspects such as the limited tuning range and linearity of tuning impedances, etc., trade-off with phase-noise (PN) performance and so on, so that this concept may only give a tuning range of, e.g., 10 ppm, 50 ppm, 500 ppm or 5000 ppm, which may not give a sufficient tuning for practical implementation. It should be appreciated that the usage of Sc-doped AlN MEMS resonators gives about five times more tuning range and hence may enable the usage of the described concept for the tuning of the oscillator.

It should be appreciated that AlN-Lamb wave resonators are intrinsically not suitable for typical frequency filter applications as they can achieve typical electromechanical coupling coefficients on the order of only 3%; for temperature compensated and/or high material Q AlN-Lamb wave resonators, the typical electromechanical coupling is as low as 1-1.5%. As an example, a typical frequency filter application, the "US-PCS duplexer" requires a electromechanical coupling coefficient of about 6% to achieve the required bandwidth, which can be met by surface acoustic wave (SAW) and bulk acoustic wave (BAW) devices. With the increase of electromechanical coupling, Sc-doped AlN-Lamb wave resonators also can easily exceed the required 6% threshold for US-PCS duplexers even for temperature compensated resonators. Furthermore, the employment of Sc-doped AlN resonators also improves the IL performance significantly, as the Rm can be lowered by a factor of 5 as shown above.

It should be further appreciated that the above described concept of tuning also can be employed for tunable frequency filters. Tuning range for filter applications can be traded-off vs. band-width and insertion loss and here Sc-doped AlN MEMS resonators would give either a superior tuning range or lower IL.

One or more aspects of the present technology may provide one or more benefits. However, it should be appreciated that not all benefits are necessarily realized by each aspect. Non-limiting examples of advantages of this technology for resonator/oscillator applications are now provided for purposes of illustration. Higher piezoelectric coupling constants may allow for reduced overall resonator size as a smaller area may be required to obtain the same piezoelectric signal size due to enhanced coupling. In addition, increased electro-mechanical coupling results in lower motional resistance ($R_m$) for the resonator, which may be highly desirable for numerous applications such as timing oscillators, filters, motion sensors and other electro-mechanical devices. A piezoelectric layer with smaller area (with equivalent coupling) contains lower static capacitance, which can be exploited to build devices with better active and passive compensation for thermal stability. Furthermore, the geometry of the resonator can be better designed to reduce unwanted spurious modes.

Other piezoelectric materials are possible candidates for improved piezoelectric coupling by doping. Thus, those non-limiting examples mentioned explicitly herein are for purposes of illustration only.

One or more aspects of the present application may be employed in various devices and settings. Non-limiting examples include: oscillators; resonators, Cellular phones, Wireless, Bluetooth, Gyroscopes, RF filters and duplexers, sensors, video cameras, video players, PDAs, personal computers, military platforms, vehicles, airplanes, PNDs, laptops, music players, and Tablet computers.

According to an aspect of the present application, a piezo-electric resonator for Lamb waves is provided, wherein the piezoelectric resonator comprises a piezoelectric layer doped with scandium or other materials to increase the piezoelectric coupling coefficient. The piezoelectric layer may be MN. The device may also include an additional temperature compensation stack. The temperature compensation stack may comprise at least one layer with positive temperature coefficient of frequency (TCF), and may also comprise at least one layer with negative TCF. The temperature compensation stack may comprise one layer with negative TCF sandwiched between two layers of positive TCF. The layer with positive TCF may be silicon dioxide. The layer with negative TCF may be silicon.

The resonator may be employed as frequency reference in an oscillator circuit. The resonator and oscillator circuit may be integrated in a larger system. A frequency filter or duplexer may include the resonator described. The resonator may additionally comprise at least one electrode used for frequency tuning, and in some embodiments the tuning may be achieved by changing the impedance between the at least one electrode used for frequency tuning and another electrode.

According to an aspect of the present application a device is provided, comprising a mechanical resonator with at least one piezoelectric layer, wherein the piezoelectric layer is doped with at least one material to change the piezoelectric coupling constant. The mechanical resonator may utilize at least one additional layer for controlling the overall thermal stability of the resonator. The doping of a suitable material also results in the change of the central frequency of at least one resonance mode, and may be used to tune the resonance frequency.

The mechanical resonator may comprise multiple piezoelectric layers in a stack configuration. The stack may contain at least one layer with a material known to have a temperature coefficient of frequency with a sign opposite to that of the piezoelectric material.

According to an aspect of the present application, a device is provided, comprising a mechanical resonator with at least one piezoelectric layer comprising a piezoelectric material, wherein the piezoelectric material contains a second material which modifies its native piezoelectric constant. The second material may be introduced to the piezoelectric material during the growth process. The second material may be introduced to the piezoelectric material by doping. The second material may be introduced to the piezoelectric material by diffusion.

Having thus described several aspects of at least one embodiment of the technology, it is to be appreciated that various alterations, modifications, and improvements will readily occur to those skilled in the art. Such alterations, modifications, and improvements are intended to be within the spirit and scope of the technology. Accordingly, the foregoing description and drawings provide non-limiting examples only.

In addition, while some references have been incorporated herein by reference, it should be appreciated that the present application controls to the extent the incorporated references are contrary to what is described herein.

What is claimed is:

1. A device, comprising:
    a piezoelectric resonator comprising a piezoelectric active layer formed of a first material and configured to vibrate in response to an actuation signal, wherein the piezoelectric active layer comprises a dopant having a concentration between approximately 15% and 35% in the first material and configured to increase a piezoelectric coupling coefficient of the piezoelectric active layer; and
    a circuit coupled to the piezoelectric resonator, the circuit having an impedance, wherein the piezoelectric resonator has a motional resistance approximately matching the impedance of the circuit.

2. The device of claim 1, wherein the dopant is Scandium.

3. The device of claim 1, wherein the first material is Aluminum Nitride (AlN).

4. The device of claim 1, wherein the circuit is an oscillator circuit, and wherein the piezoelectric resonator is configured to provide a frequency reference signal for the oscillator circuit.

5. The device of claim 1, wherein the device forms at least part of a frequency filter.

6. The device of claim 1, wherein the device forms at least part of a duplexer.

7. The device of claim 1, further comprising at least one electrode configured to tune a resonance frequency of the piezoelectric resonator.

8. The device of claim 1, further comprising a multi-layer temperature compensation structure coupled to the piezoelectric active layer.

9. The device of claim 8, wherein the temperature compensation structure comprises at least one layer with positive temperature coefficient of frequency (TCF).

10. The device of claim 9, wherein the temperature compensation structure also comprises at least one layer with negative TCF.

11. The device of claim 10, wherein the temperature compensation structure comprises one layer with negative TCF sandwiched between two layers with positive TCF.

12. The device of claim 11, wherein a layer with positive TCF of the temperature compensation structure is formed of silicon dioxide.

13. The device of claim 11, wherein the at least one layer with negative TCF is silicon.

14. The device of claim 1, wherein the dopant is configured to change a resonance frequency of at least one resonance mode of the piezoelectric resonator.

15. The device of claim 14, wherein the dopant is used to tune the resonance frequency.

16. The device of claim 1, wherein the piezoelectric resonator comprises multiple layers in a stack configuration.

17. The device of claim 16, wherein the stack configuration contains at least one layer having a temperature coefficient of frequency with a sign opposite to that of the piezoelectric active layer.

18. The device of claim 1, wherein the piezoelectric resonator is a piezoelectric lamb wave resonator configured to support lamb waves.

* * * * *